(12) United States Patent
Du et al.

(10) Patent No.: US 10,923,060 B2
(45) Date of Patent: Feb. 16, 2021

(54) SHIFT REGISTER UNIT WITH POWER SIGNAL TERMINALS HAVING SAME FREQUENCIES AND REVERSE PHASES, SHIFT REGISTER CIRCUIT AND DISPLAY PANEL

(71) Applicants: BOE TECHNOLOGY GROUP CO., LTD., Beijing (CN); Hefei Xinsheng Optoelectronics Technology Co., Ltd., Anhui (CN)

(72) Inventors: Ruifang Du, Beijing (CN); Xiping Wang, Beijing (CN); Rui Ma, Beijing (CN); Xiaoye Ma, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 196 days.

(21) Appl. No.: 16/300,977

(22) PCT Filed: Mar. 20, 2018

(86) PCT No.: PCT/CN2018/079663
§ 371 (c)(1),
(2) Date: Nov. 13, 2018

(87) PCT Pub. No.: WO2018/192331
PCT Pub. Date: Oct. 25, 2018

(65) Prior Publication Data
US 2020/0320945 A1  Oct. 8, 2020

(30) Foreign Application Priority Data
Apr. 19, 2017 (CN) .......................... 201710257809.6

(51) Int. Cl.
*G09G 3/36* (2006.01)
*G09G 3/3266* (2016.01)

(52) U.S. Cl.
CPC ......... *G09G 3/3674* (2013.01); *G09G 3/3266* (2013.01); *G09G 2310/0286* (2013.01)

(58) Field of Classification Search
CPC .................................................. G09G 3/3674
See application file for complete search history.

(56) References Cited

U.S. PATENT DOCUMENTS

2008/0219401 A1* 9/2008 Tobita .................... G11C 19/28
377/79
2012/0008731 A1* 1/2012 Hsu ...................... G09G 3/3674
377/79

(Continued)

FOREIGN PATENT DOCUMENTS

CN        104252853 A    12/2014
CN        105096879 A    11/2015

(Continued)

OTHER PUBLICATIONS

Search Report and Written Opinion for International Application No. PCT/CN2018/079663 dated Jun. 14, 2018.

(Continued)

*Primary Examiner* — Chun-Nan Lin
(74) *Attorney, Agent, or Firm* — Calfee, Halter & Griswold LLP

(57) ABSTRACT

A shift register unit, a shift register circuit and a display panel is provided. The shift register unit includes: an input circuit configured to transmit a power signal to the pull-up node; an output circuit configured to transmit a clock signal to the signal output terminal; a reset circuit configured to transmit a reference signal to the pull-up node and the signal output terminal; a first pull-down control circuit configured to transmit the reference signal to the pull-down control (Continued)

node and the pull-down node; a second pull-down control circuit configured to transmit the power signal to the pull-down control node and the pull-down node; and a pull-down circuit configured to transmit the reference signal to the pull-up node and the signal output terminal.

15 Claims, 5 Drawing Sheets

(56) References Cited

U.S. PATENT DOCUMENTS

| | | |
|---|---|---|
| 2017/0364170 A1* | 12/2017 | Gu .......................... G11C 7/02 |
| 2018/0025687 A1 | 1/2018 | Wang |
| 2018/0293924 A1* | 10/2018 | Wang ..................... G11C 19/28 |
| 2019/0012948 A1* | 1/2019 | Ohara ................. G09G 3/3258 |
| 2019/0114952 A1* | 4/2019 | Li ........................... G09G 3/20 |
| 2020/0020266 A1* | 1/2020 | Feng ....................... G09G 3/20 |

FOREIGN PATENT DOCUMENTS

| | | |
|---|---|---|
| CN | 105185349 A | 12/2015 |
| CN | 105245089 A | 1/2016 |
| CN | 105859566 A | 8/2016 |
| CN | 105869566 A | 8/2016 |
| CN | 105976755 A | 9/2016 |
| CN | 205595037 U | 9/2016 |
| CN | 106205520 A | 12/2016 |
| CN | 106486082 A | 3/2017 |
| CN | 106504719 A | 3/2017 |
| CN | 106910470 A | 6/2017 |
| WO | 2017076111 A1 | 5/2017 |
| WO | 2017193627 A1 | 11/2017 |

OTHER PUBLICATIONS

First Office Action for Chinese Patent Application No. 20170257809.6 dated Jul. 27, 2018.

* cited by examiner

SHIFT REGISTER UNIT WITH POWER SIGNAL TERMINALS HAVING SAME FREQUENCIES AND REVERSE PHASES, SHIFT REGISTER CIRCUIT AND DISPLAY PANEL

CROSS REFERENCE

The present application is a continued application of International Application No. PCT/CN2018/079663, filed on Mar. 20, 2018, which is based upon and claims priority to Chinese Patent Application No. 201710257809.6, filed on Apr. 19, 2017, and the entire contents thereof are incorporated herein by reference.

TECHNICAL FIELD

The present disclosure relates to display technologies, and particularly to a shift register unit, a shift register circuit and a display panel.

BACKGROUND

With the development of optical technologies and semiconductor technologies, flat panel displays represented by Liquid Crystal Displays (LCDs) and Organic Light Emitting Diode (OLED) displays have been developed to have advantages such as light weight and small size, low energy consumption, fast response, high color purity and high contrast ratio, and thus have dominated the display field. In recent years, display devices have shown a trend of high integration and low costs. The Gate Driver on Array (GOA) technology is a representative technology which is used to integrate a gate drive circuit into a peripheral area of an array substrate, thereby effectively reducing the manufacturing costs of the display device while achieving a narrow bezel design and improving module process yield.

However, there is a certain signal delay in conventional GOA cascade structure.

It should be noted that the information disclosed in the Background section above is only for enhancing the understanding of the background of the present disclosure, and thus may include information that does not constitute prior art known to those of ordinary skill in the art.

SUMMARY

Embodiments of the present disclosure provide a shift register unit, a shift register circuit and a display panel, so as to at least partially overcome one or more problems due to limitations and defects of the related arts.

Other properties and advantages of the present disclosure will become apparent from the following descriptions, or may be learned from the practice of the present disclosure.

According to an embodiment of the present disclosure, there is provided a shift register unit, including:

an input circuit connected to a signal input terminal, a power signal terminal and a pull-up node and configured to transmit a power signal to the pull-up node in response to an input signal;

an output circuit connected to the pull-up node, a clock signal terminal, and a signal output terminal and configured to transmit a clock signal to the signal output terminal in response to a voltage at the pull-up node;

a reset circuit connected to a reset signal terminal, a reference signal terminal, the pull-up node and the signal output terminal and configured to transmit a reference signal to the pull-up node and the signal output terminal in response to a reset signal;

a first pull-down control circuit connected to the pull-up node, the reference signal terminal, a pull-down control node and a pull-down node and configured to transmit the reference signal to the pull-down control node and the pull-down node in response to the voltage signal at the pull-up node;

a second pull-down control circuit connected to the power signal terminal, the pull-down control node and the pull-down node and configured to transmit the power signal to the pull-down control node and the pull-down node in response to the power signal; and a pull-down circuit connected to the pull-down node, the reference signal terminal, the pull-up node and the signal output terminal and configured to transmit the reference signal to the pull-up node and the signal output terminal in response to a voltage signal at the pull-down node.

In an exemplary embodiment of the present disclosure, the power signal terminal includes a first power signal terminal and a second power signal terminal;

a first power signal provided by the first power signal terminal and a second power signal provided by the second power signal terminal have same frequencies but reverse phases.

In an exemplary embodiment of the present disclosure, the input circuit includes:

a first switching element, wherein a control terminal of the first switching element is connected to the signal input terminal, a first terminal the first switching element is connected to a pull-up control node, and a second terminal the first switching element 1 is connected to the pull-up node;

a second switching element, wherein a control terminal and a first terminal of the second switching element are connected to the first power signal terminal, and a second terminal of the second switching element is connected to the pull-up control node; and a third switching element, wherein a control terminal and a first terminal of the third switching element are connected to the second power signal terminal, and a second terminal of the third switching element is connected to the pull-up control node.

In an exemplary embodiment of the present disclosure, the pull-down control node includes a first pull-down control node, and the pull-down node includes a first pull-down node;

the first pull-down control circuit includes:

a fourth switching element, wherein a control terminal of the fourth switching element is connected to the pull-up node, a first terminal of the fourth switching element is connected to the reference signal terminal, and a second terminal of the fourth switching element is connected to the first pull-down control node; and a fifth switching element, wherein a control terminal of the fifth switching element is connected to the pull-up node, a first terminal of the fifth switching element is connected to the reference signal terminal, and a second terminal of the fifth switching element is connected to the first pull-down node;

the second pull-down control circuit includes:

a sixth switching element, wherein a control terminal and a first terminal of the sixth switching element are connected to the first power signal terminal, and a second terminal of the sixth switching element is connected to the first pull-down control node; and a seventh switching element, wherein a control terminal of the seventh switching element is connected to the first pull-down control node, a first terminal of the seventh switching element is connected to the first power signal terminal, and a second terminal of the seventh switching element is connected to the first pull-down node.

In an exemplary embodiment of the present disclosure, the pull-down control node further includes a second pull-down control node, and the pull-down node further includes a second pull-down node;

the first pull-down control circuit further includes:

an eighth switching element, wherein a control terminal of the eighth switching element is connected to the pull-up node, a first terminal of the eighth switching element is connected to the reference signal terminal, and a second terminal of the eighth switching element is connected to the second pull-down control node; and a ninth switching element, wherein a control terminal of the ninth switching element is connected to the pull-up node, a first terminal of the ninth switching element is connected to the reference signal terminal, and a second terminal of the ninth switching element is connected to the second pull-down node;

the second pull-down control circuit further includes:

a tenth switching element, wherein a control terminal and a first terminal of the tenth switching element are connected to the second power signal terminal, and a second terminal of the tenth switching element is connected to the second pull-down control node; and an eleventh switching element, wherein a control terminal of the eleventh switching element is connected to the second pull-down control node, a first terminal of the eleventh switching element is connected to the second power signal terminal, and a second terminal of the eleventh switching element is connected to the second pull-down node.

In an exemplary embodiment of the present disclosure, the pull-down circuit includes:

a twelfth switching element, wherein a control terminal of the twelfth switching element is connected to the first pull-down node, a first terminal of the twelfth switching element is connected to the reference signal terminal, and a second terminal of the twelfth switching element is connected to the pull-up node;

a thirteenth switching element, wherein a control terminal of the thirteenth switching element is connected to the first pull-down node, a first terminal of the thirteenth switching element is connected to the reference signal terminal, and a second terminal of the thirteenth switching element is connected to the signal output terminal;

a fourteenth switching element, wherein a control terminal of the fourteenth switching element is connected to the second pull-down node, a first terminal of the fourteenth switching element is connected to the reference signal terminal, and a second terminal of the fourteenth switching element is connected to the pull-up node; and a fifteenth switching element, wherein a control terminal of the fifteenth switching element is connected to the second pull-down node, a first terminal of the fifteenth switching element is connected to the reference signal terminal, and a second terminal of the fifteenth switching element is connected to the signal output terminal.

In an exemplary embodiment of the present disclosure, the output circuit includes:

a sixteenth switching element, wherein a control terminal of the sixteenth switching element is connected to the pull-up node, a first terminal of the sixteenth switching element is connected to the clock signal terminal, and a second terminal of the sixteenth switching element is connected to the signal output terminal; and a storage capacitor connected between the pull-up node and the signal output terminal.

In an exemplary embodiment of the present disclosure, the reset signal terminal includes a first reset signal terminal and a second reset signal terminal;

the reset circuit includes:

a seventeenth switching element, wherein a control terminal of the seventeenth switching element is connected to the first reset signal terminal, a first terminal of the seventeenth switching element is connected to the reference signal terminal, and a second terminal of the seventeenth switching element is connected to the pull-up node; and an eighteenth switching element, wherein a control terminal of the eighteenth switching element is connected to the second reset signal terminal, a first terminal of the eighteenth switching element is connected to the reference signal terminal, and a second terminal of the eighteenth switching element is connected to the signal output terminal.

According to an embodiment of the present disclosure, there is provided a shift register circuit including a plurality of cascaded shift register units as described above;

wherein:

if the reset signal terminal includes the first reset signal terminal and the second reset signal terminal, a signal output terminal of a (N−3)-th stage shift register unit is connected to a signal input terminal of a N-th stage shift register unit;

a signal output terminal of a (N+3)-th stage shift register unit is connected to a second reset signal terminal of the N-th stage shift register unit;

a signal output terminal of a (N+4)-th stage shift register unit is connected to a first reset signal terminal of the N-th stage shift register unit;

wherein N is an integer and N≥3.

According to an embodiment of the present disclosure, there is provide a display panel including a display area and a peripheral area; wherein the peripheral area is provided with the shift register circuit as described above.

The above general description and the following detailed description are merely exemplary and explanatory and should not construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

DETAILED DESCRIPTION

Figure 1:
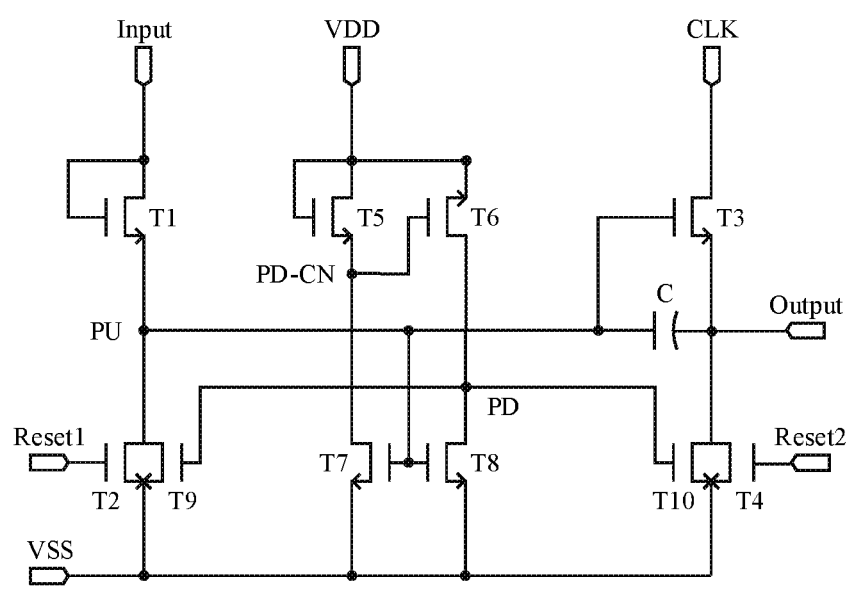
FIG. 1 is a schematic structural view showing a GOA unit in related arts.

Exemplary embodiments will now be described more fully with reference to accompanying drawings. However, the exemplary embodiments can be embodied in a variety of forms and should not be construed as being limited to the examples set forth herein; rather, these embodiments are provided to make this disclosure more complete, and convey the idea of the present disclosure to those skilled in the art. The described features, structures, or characteristics may be combined in any suitable manner in one or more embodiments.

In addition, the drawings are merely schematic representations of the present disclosure and are not necessarily drawn to scale. The same reference numbers in the drawings denote the same or similar parts, and the repeated descriptions thereof will be omitted. Some of the block diagrams shown in the figures are functional entities and do not necessarily correspond to physically or logically separate entities. These functional entities may be implemented in software, or implemented in one or more hardware modules or integrated circuits, or implemented in different networks and/or processor devices and/or microcontroller devices.

Figure 2:
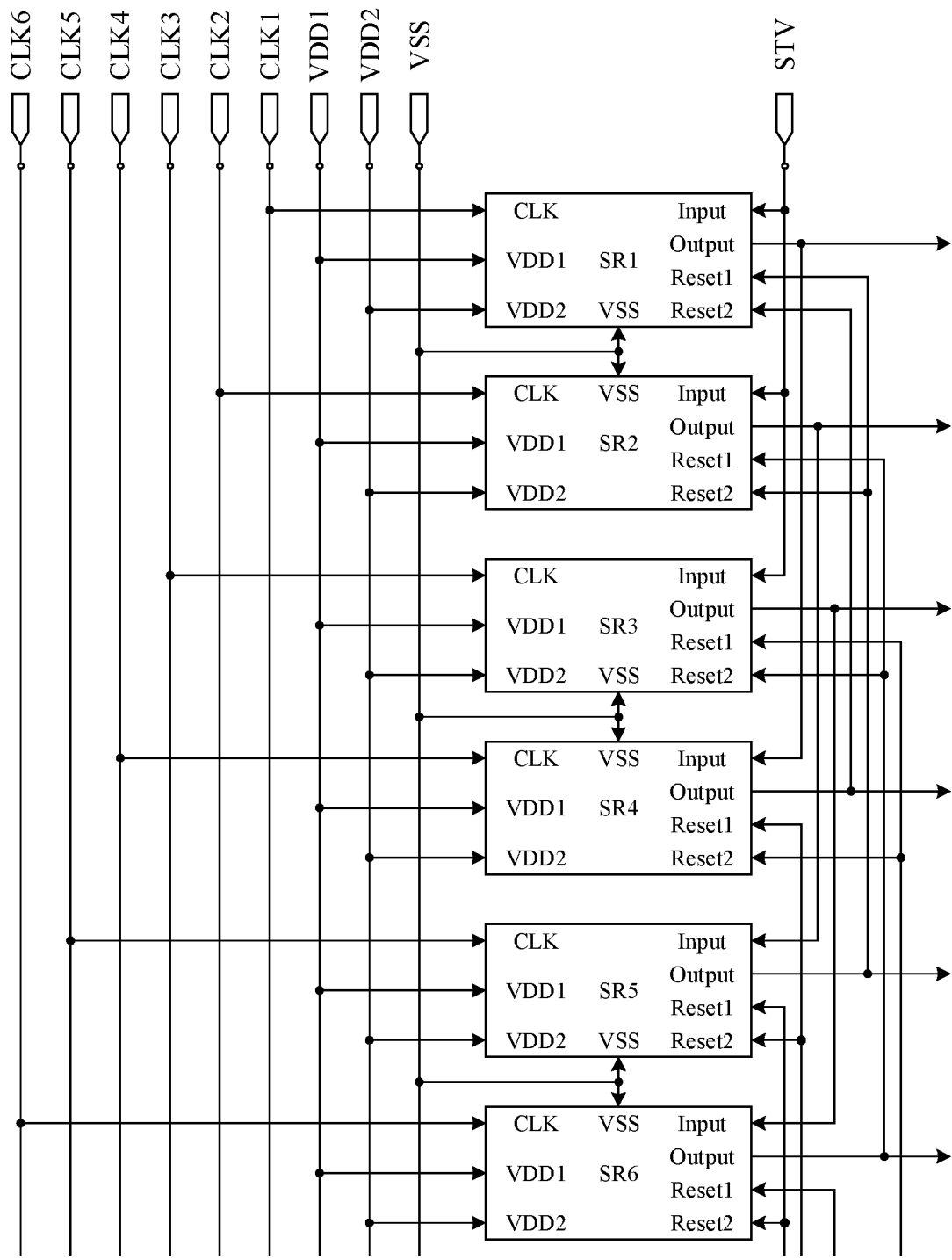
FIG. 2 is a view schematically showing a cascade structure of a GOA circuit in related arts.

FIG. 1 is a structural diagram of a GOA unit in related arts, and the cascade relationship of GOA units is shown in FIG. 2.

Referring to FIG. 2, a plurality of GOA units may be connected in cascade to form a gate driving circuit. Each of the stage in the cascade structure may be a GOA unit. The plurality of stages are responsible for outputting scanning signals for driving gate lines in a display panel. The number of stages depends on the number of gate lines.

Taking a 6CLK circuit model as an example, the output signal of the signal output terminal Output of the N-th stage GOA unit is the input signal of the signal input terminal Input of the (N+3)-th stage GOA unit, the output signal of the signal output terminal Output of the (N+3)-th stage GOA unit is the first reset signal of the first reset signal terminal Reset1 of the N-th stage GOA unit, and the output signal of the signal output terminal Output of the (N+4)-th stage GOA unit is the second reset signal of the second reset signal terminal Reset2 of the N-th stage GOA unit. For the input signal of the signal input terminal Input of the (N+3)-th stage GOA unit, the output signal of the signal output terminal Output of the N-th stage GOA unit serves as the gate control signal of the first transistor T1 as well as the source input signal of the first transistor T1. Because the signal output terminal Output of the N-th stage GOA unit is also connected to pixels in the active area, the input signal of the signal input terminal Input of the (N+3)-th stage GOA unit inevitably has a certain signal delay.

Figure 3:
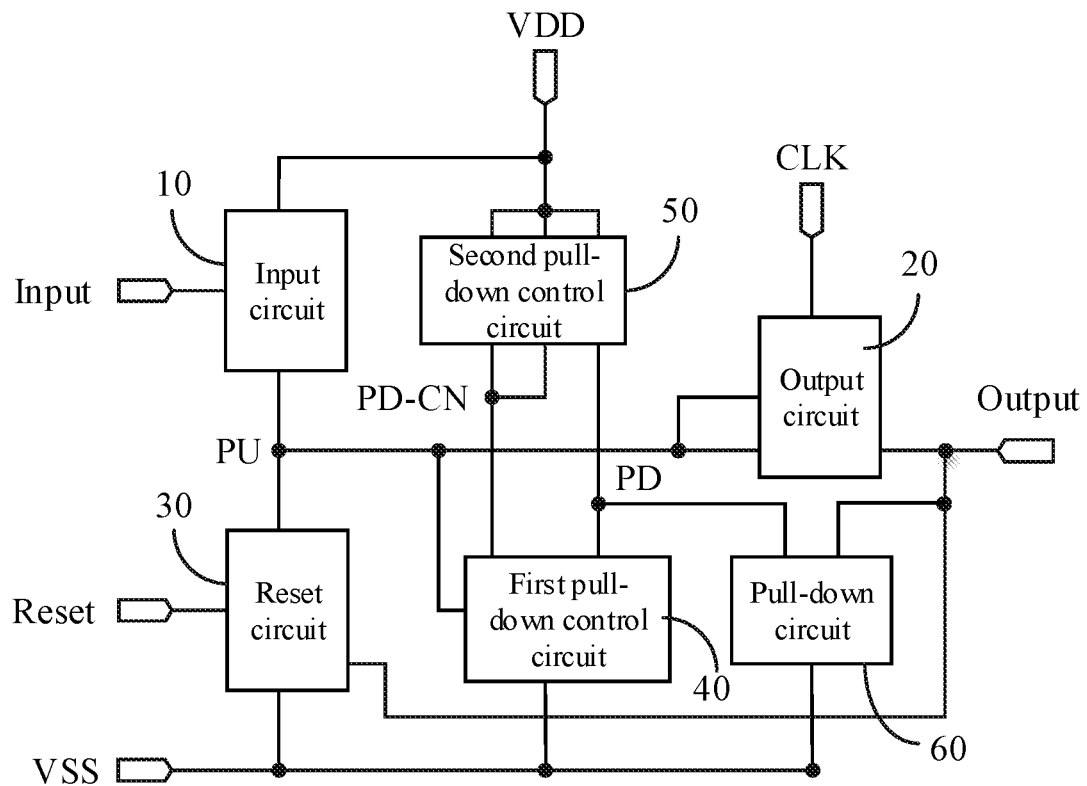
FIG. 3 is a block diagram showing a structure of a shift register unit according to an exemplary embodiment of the present disclosure.

An exemplary embodiment of the present disclosure provides a shift register unit for providing a gate driving signal. As shown in FIG. 3, the shift register unit may include an input circuit 10, an output circuit 20, a reset circuit 30, a first pull-down control circuit 40, a second pull-down control circuit 50, and a pull-down circuit 60.

The input circuit 10 is connected to a signal input terminal Input, a power signal terminal VDD and a pull-up node PU and is configured to transmit a power signal to the pull-up node PU in response to an input signal.

The output circuit 20 is connected to the pull-up node PU, a clock signal terminal CLK and a signal output terminal Output and is configured to transmit a clock signal to the signal output terminal Output in response to the voltage signal at the pull-up node PU.

The reset circuit 30 is connected to a reset signal terminal Reset, a reference signal terminal VSS, the pull-up node PU and the signal output terminal Output and is configured to transmit the reference signal to the pull-up node PU and the signal output terminal Output in response to a reference signal.

The first pull-down control circuit 40 is connected to the pull-up node PU, the reference signal terminal VSS, a pull-down control node PD-CN and a pull-down node PD and is configured to transmit the reference signal to the pull-down control node PD-CN and the pull-down node PD in response to a voltage at the pull-up node PU.

The second pull-down control circuit 50 is connected to the power signal terminal VDD, the pull-down control node PD-CN and the pull-down node PD and is configured to transmit the power signal to the pull-down control node PD-CN and the pull-down node PD in response to the power signal.

The pull-down circuit 60 is connected to the pull-down node PD, the reference signal terminal VSS, the pull-up node PU and the signal output terminal Output and is configured to transmit the reference signal to the pull-up node PU and the signal output terminal Output in response to a voltage at the pull-down node PD.

The input signal is a voltage signal of the signal input terminal Input, the power signal is a voltage signal of the power signal terminal VDD, the clock signal is a voltage signal of the clock signal terminal CLK, the reset signal is a voltage signal of the reset signal terminal Reset, and the reference signal is a voltage signal of the reference signal terminal VSS.

In the shift register unit provided by the exemplary embodiment of the present disclosure, the input circuit 10 can transmit the power signal of the power signal terminal VDD to the pull-up node PU under the control of the signal input terminal Input, so that the output circuit 20 transmits the clock signal of the clock signal terminal CLK the signal output terminal Output under the control of the pull-up node PU, thereby realizing the signal output of the shift register unit. Since the input circuit 10 of the shift register unit uses the power signal as the charging signal of the pull-up node PU, and the power signal is directly provided by the signal terminal of the PCB board, the shift register unit provided by the present exemplary embodiment can significantly address the cascade delay phenomenon of the charging signal of the pull-up node PU, thereby improving the quality of the gate driving.

Considering the service life of the shift register unit, the first pull-down control circuit 40, the second pull-down control circuit 50, and the pull-down circuit 60 may be divided into two sets of alternate working units. For example, the first pull-down control circuit 40 may include a first pull-down control unit and a third pull-down control unit, the second pull-down control circuit 50 may include a second pull-down control unit and a fourth pull-down control unit, and the pull-down circuit 60 may include a first pull-down unit and a second pull-down unit. The first pull-down control unit and the second pull-down control unit may be connected to the first pull-down control node PD-CN1 and the first pull-down node PD1, and the third pull-down control unit and the fourth pull-down control unit may be connected to the second pull-down control node PD-CN2 and the second pull-down node PD2, the first pull-down unit may be connected to the first pull-down node PD1, and the second pull-down unit may be connected to the second pull-down node PD2.

Figure 4:
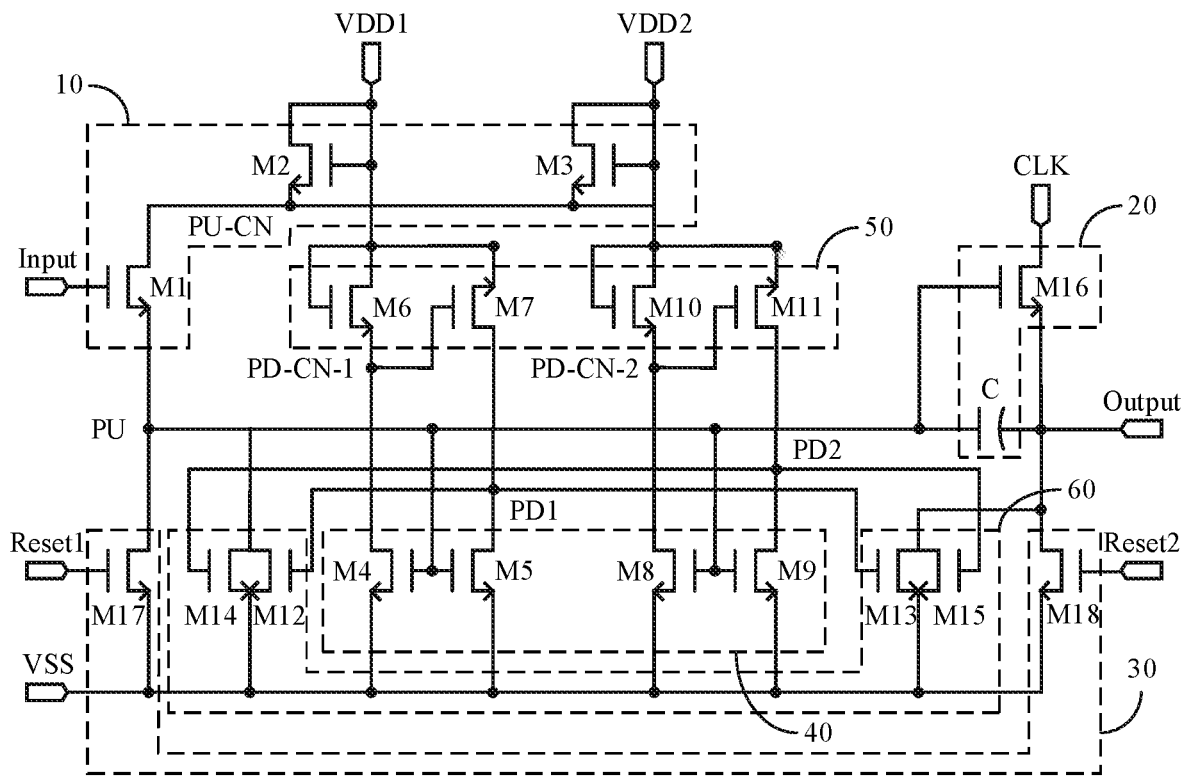
FIG. 4 is a schematic diagram showing a structure of a shift register unit according to an exemplary embodiment of the present disclosure.

In this case, as shown in FIG. 4, the power signal terminal VDD may include a first power signal terminal VDD1 and a second power signal terminal VDD2, and the first power signal provided by the first power signal terminal VDD1 and the second power signal provided by the signal power signal terminal VDD2 have the same frequencies but inverse phases.

The structure of the shift register unit in the present exemplary embodiment will be described in detail below with reference to FIG. 4.

The input circuit 10 can include a first switching element M1, a second switching element M2 and a third switching element M3.

A control terminal of the first switching element M1 is connected to the signal input terminal Input, a first terminal of the first switching element M1 is connected to the pull-up control node PU-CN, and a second terminal of the first switching element M1 is connected to the pull-up node PU.

A control terminal and a first terminal of the second switching element M2 are connected to the first power signal terminal VDD1, and a second terminal of the second switching element M2 is connected to the pull-up control node PU-CN.

A control terminal and a first terminal of the third switching element M3 are connected to the second power signal terminal VDD2, and a second terminal of the third switching element M3 is connected to the pull-up control node PU-CN.

The first power signal and the second power signal have the same frequencies but reverse phases, that is, the first power signal terminal VDD1 and the second power signal terminal VDD2 alternately operate.

The working principle of the input circuit 10 is as follows. Under the control of the first power signal, the second switching element M2 is turned on to transmit the first power signal to the pull-up control node PU-CN, and then under the control of the input signal, the first switching element M1 is turned on to transmit the voltage signal of the pull-up control node PU-CN to the pull-up node PU; or, under the control of the second power signal, the third switching element M3 is turned on to transmit the second power signal to the pull-up control node PU-CN, and then, under the control of the input signal, the first switching element M1 is turned on to transmit the voltage signal of the pull-up control node PU-CN to the pull-up node PU. It can be seen that the voltage signal of the pull-up node PU actually comes from the first power signal or the second power signal; that is, in this embodiment, the first power signal or the second power signal charges the pull-up node PU.

It should be noted that, in this embodiment, the first power signal terminal VDD1 and the second power signal terminal VDD2 alternately operate, but the present embodiment does not specifically define the duty cycle of the first power signal and the second power signal, as long as one of the first and second power signals can operate.

The output circuit 20 can include a sixteenth switching element M16 and a storage capacitor C.

A control terminal of the sixteenth switching element M16 is connected to the pull-up node PU, a first terminal of the sixteenth switching element M16 is connected to the clock signal terminal CLK, and a second terminal of the sixteenth switching element M16 is connected to the signal output terminal Output.

The storage capacitor C is connected between the pull-up node PU and the signal output terminal Output.

The working principle of the output circuit 20 is as follows. The charging voltage of the pull-up node PU is stored in the storage capacitor C. After the charging phase is ended, the voltage of the pull-up node PU is held by the storage capacitor C, and under the control of the voltage signal of the pull-up node PU, the sixteenth switching element M16 is turned on to transmit the clock signal to the signal output terminal Output, thereby realizing the signal output of the shift register unit of the present stage.

The first pull-down control circuit 40 can include a fourth switching element M4, and a fifth switching element M5.

A control terminal of the fourth switching element M4 is connected to the pull-up node PU, a first terminal of the fourth switching element M4 is connected to the reference signal terminal VSS, and a second terminal of the fourth switching element M4 is connected to the first pull-down control node PD-CN1.

A control terminal of the fifth switching element M5 is connected to the pull-up node PU, a first terminal of the fifth switching element M5 is connected to the reference signal terminal VSS, and a second terminal of the fifth switching element M5 is connected to the first pull-down node PD1.

The first pull-down control circuit 40 may further include an eighth switching element M8 and a ninth switching element M9.

A control terminal of the eighth switching element M8 is connected to the pull-up node PU, a first terminal of the eighth switching element M8 is connected to the reference signal terminal VSS, and a second terminal of the eighth switching element M8 is connected to the second pull-down control node PD-CN2.

A control terminal of the ninth switching element M9 is connected to the pull-up node PU, a first terminal of the ninth switching element M9 is connected to the reference signal terminal VSS, and a second terminal of the ninth switching element M9 is connected to the second pull-down node PD2.

The fourth switching element M4 and the fifth switching element M5 may constitute a first pull-down control unit for pulling down the voltages of the first pull-down node PD-CN1 and the first pull-down node PD1; the eighth switching element M8 and the ninth switching element M9 may constitute a third pull-down control unit for pulling down the voltages of the second pull-down node PD-CN2 and the second pull-down node PD2.

The working principle of the first pull-down control circuit 40 is as follows. Under the control of the pull-up node PU, the fourth switching element M4 is turned on to transmit the reference signal to the first pull-down control node PD-CN1, and the fifth switching element M5 is turned on to transmit the reference signal to the first pull-down node PD1, the eighth switching element M8 is turned on to transmit the reference signal to the second pull-down control node PD-CN2, and the ninth switching element M9 is turned on to transmit the reference signal to the second pull-down node PD2, thereby ensuring that the first pull-down node PD1 and the second pull-down node PD2 are at a low level.

The second pull-down control circuit 50 can include a sixth switching element M6 and a seventh switching element M7.

A control terminal and a first terminal of the sixth switching element M6 are connected to the first power signal terminal VDD1, and a second terminal of the sixth switching element M6 is connected to the first pull-down control node PD-CN1.

A control terminal of the seventh switching element M7 is connected to the first pull-down control node PD-CN1, a first terminal of the seventh switching element M7 is connected to the first power signal terminal VDD1, and a second terminal of the seventh switching element M7 is connected to the first pull-down node PD1.

The second pull-down control circuit 50 may further include a tenth switching element M10 and an eleventh switching element M11.

A control terminal and a first terminal of the tenth switching element M10 are connected to the second power signal terminal VDD2, and a second terminal of the tenth switching element M10 is connected to the second pull-down control node PD-CN2.

A control terminal of the eleventh switching element M11 is connected to the second pull-down control node PD-CN2, a first terminal of the eleventh switching element M11 is connected to the second power signal terminal VDD2, and a second terminal of the eleventh switching element M11 is connected to the second pull-down node PD2.

The sixth switching element M6 and the seventh switching element M7 may constitute a second pull-down control unit for pulling up the voltages of the first pull-down node PD-CN1 and the first pull-down node PD1; the tenth switching element M10 and the eleventh switching element M11 may constitute a fourth pull-down control unit for pulling up the voltages of the second pull-down control node PD-CN2 and the second pull-down node PD2.

The working principle of the second pull-down control circuit 50 is as follows. Under the control of the first power signal, the sixth switching element M6 is turned on to transmit the first power signal to the first pull-down control node PD-CN1, and under the control of the voltage signal of the pull-down control node PD-CN1, the seventh switching element M7 is turned on to transmit the first power signal to the first pull-down node PD1; or, under the control of the second power signal, the tenth switching element M10 is turned on to transmit the second power signal to the second pull-down control node PD-CN2, and further, under the control of the voltage signal of the second pull-down control node PD-CN2, the eleventh switching element M11 is turned on to transmit the second power supply signal to the second pull-down node PD2. Since the first power signal and the second power signal have the same frequencies but reverse phases, the second pull-down control unit and the fourth pull-down control unit work alternately, thereby ensuring that one of the first pull-down node PD1 and the second pull-down node PD2 is at a high level.

The pull-down circuit 60 can include a twelfth switching element M12, a thirteenth switching element M13, a fourteenth switching element M14 and a fifteenth switching element M15.

A control terminal of the twelfth switching element M12 is connected to the first pull-down node PD1, a first terminal of the twelfth switching element M12 is connected to the reference signal terminal VSS, and a second terminal of the twelfth switching element M12 is connected to the pull-up node PU.

A control terminal of the thirteenth switching element M13 is connected to the first pull-down node PD1, a first terminal of the thirteenth switching element M13 is connected to the reference signal terminal VSS, and a second terminal of the thirteenth switching element M13 is connected to the signal output terminal Output.

A control terminal of the fourteenth switching element M14 is connected to the second pull-down node PD2, a first terminal of the fourteenth switching element M14 is connected to the reference signal terminal VSS, and a second terminal of the fourteenth switching element M14 is connected to the pull-up node PU.

A control terminal of the fifteenth switching element M15 is connected to the second pull-down node PD2, a first terminal of the fifteenth switching element M15 is connected to the reference signal terminal VSS, and a second terminal of the fifteenth switching element M15 is connected to the signal output terminal Output.

The twelfth switching element M12 and the thirteenth switching element M13 may constitute a first pull-down unit for pulling down the voltages of the pull-up node PU and the signal output terminal Output under the control of the voltage signal of the first pull-down node PD1. The fourteenth switching element M14 and the fifteenth switching element M15 may constitute a second pull-down unit for pulling down the voltages of the pull-up node PU and the signal output terminal Output under the control of the voltage signal of the second pull-down node PD2.

The working principle of the pull-down circuit 60 is as follows. Under the control of the first pull-down node PD1, the twelfth switching element M12 is turned on to transmit the reference signal to the pull-up node PU, and the thirteenth switching element M13 is turned on to transmit the reference signal to the signal output terminal Output; or, under the control of the second pull-down node PD2, the fourteenth switching element M14 is turned on to transmit the reference signal to the pull-up node PU, and the fifteenth switching element M15 is turned on to transmit the reference signal to the signal output terminal Output. The first pull-down unit and the second pull-down unit work alternately, thereby ensuring that the voltages of the pull-up node PU and the signal output terminal Output are pulled down.

The reset circuit 30 can include a seventeenth switching element M17 and an eighteenth switching element M18.

A control terminal of the seventeenth switching element M17 is connected to the first reset signal terminal Reset1, a first terminal of the seventeenth switching element M17 is connected to the reference signal terminal VSS, and a second terminal of the seventeenth switching element M17 is connected to the pull-up node PU.

A control terminal of the eighteenth switching element M18 is connected to the second reset signal terminal Reset2, a first terminal of the eighteenth switching element M18 is connected to the reference signal terminal VSS, and a second terminal of the eighteenth switching element M18 is connected to the signal output terminal Output.

The working principle of the reset circuit 30 is as follows. Under the control of the first reset signal, the seventeenth switching element M17 is turned on to transmit the reference signal to the pull-up node PU, and under the control of the second reset signal, the eighteenth switching element M18 is turned on to transmit the reference signal to the signal output terminal, thereby realizing resetting of the pull-up node PU and the signal output terminal Output.

In the exemplary embodiment, all of the switching elements may be MOS (Metal Oxide Semiconductor) field effect transistors, which may be P-type MOS transistors or N-type MOS transistors. It should be noted that for different transistor types, the levels of respective signal terminals need corresponding adjustments.

The working procedure of the shift register unit having the structure as described above according to an embodiment of the present disclosure will be described in detail with reference to the timing diagram shown in FIG. 5, taking all the switching elements being NMOS as an example. The reference signal of the reference signal terminal VSS is a low level signal; the first power signal of the first power signal terminal VDD1 and the second power signal of the second power signal terminal VDD2 have the same frequencies but have phases opposite to each other, that is, there is always one of the first and second power signals in operation. In the following description, the high-level period of the first power signal is taken as an example for illustration.

Charging Stage:

The first power signal is at a high level, the second switching element M2 is turned on to transmit the first power signal to the pull-up control node PC-CN. The input signal is at a high level, and the first switching element M1 is turned on to transmit the voltage signal of the pull-up control node PC-CN to the pull-up node PU and the storage capacitor C is charged, and the pull-up node PU is at a high level. Under the action of the pull-up node PU, the fourth switching element M4 and the fifth switching element M5 are turned on to transmit the reference signal to the first pull-down control node PD-CN1 and the first pull-down node PD1, and the eighth switching element M8 and the ninth switching element M9 are turned on to transmit the reference signal to the second pull-down control node PD-CN2 and the second pull-down node PD2.

Output Stage:

The clock signal is at a high level. Under the action of the pull-up node PU, the sixteenth switching element M16 is turned on and the bootstrap function of the storage capacitor C causes the pull-up node PU to have a higher potential, and the sixteenth switching elements M16 are sufficiently turned on to transmit the clock signal to the signal output terminal, thereby outputting a high level signal.

Discharge Phase:

The potential of the pull-up node PU gradually goes down, and under the action of the first power signal, the sixth switching element M6 is turned on to transmit the first power signal to the first pull-down control node PD-CN1, and under the action of the first pull-down control node PD-CN1, the seventh switching element M7 is turned on to transmit the first power signal to the first pull-down node PD1, and the first pull-down node PD1 is at a high level. Under the action of the node PD1, the twelfth switching element M12 is turned on to transmit the reference signal to the pull-up node PU, and the thirteenth switching element M13 is turned on to transmit the reference signal to the signal output terminal Output, thereby pulling down the voltages of the pull-up node PU and the signal output terminal Output.

Reset Phase:

The second reset signal is at a high level. The eighteenth switching element M18 is turned on to transmit the reference signal to the signal output terminal Output, thereby resetting the signal output terminal Output. The first reset signal is at a high level. The seventeenth switching element M17 is turned on to transmit the reference signal to the pull-up node PU, thereby resetting the pull-up node PU.

Figure 5:
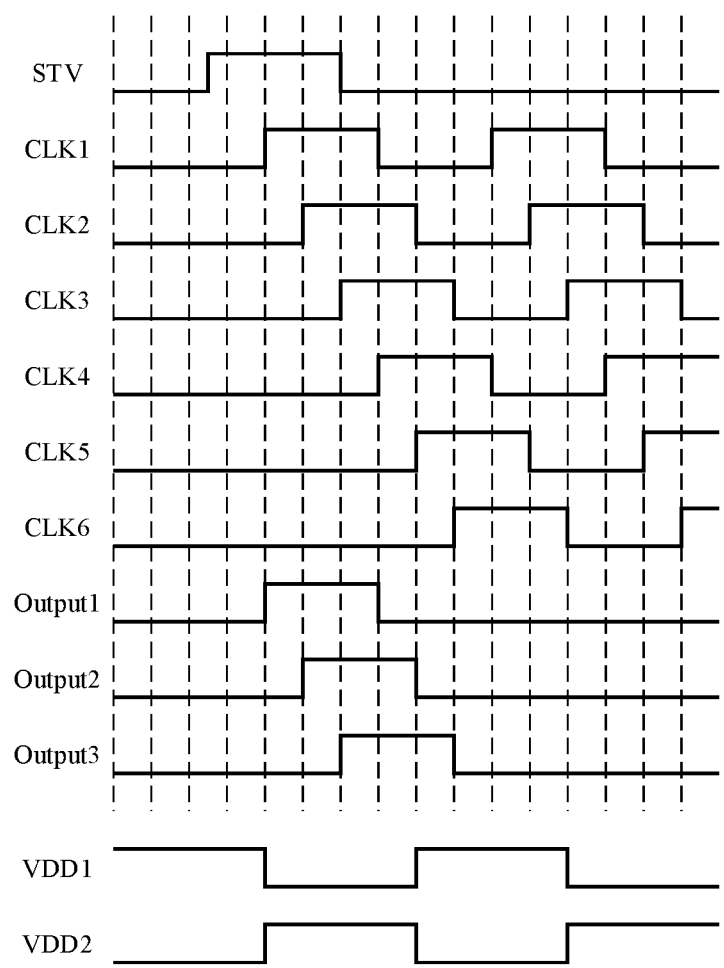
FIG. 5 schematically shows a timing chart of a shift register unit according to an exemplary embodiment of the present disclosure.

It should be noted that the periods of the first power signal and the second power signal in FIG. 5 are not necessarily related to the periods of other signals, such as a clock signal, and the first and second power signals in FIG. 5 are merely examples.

Figure 6:
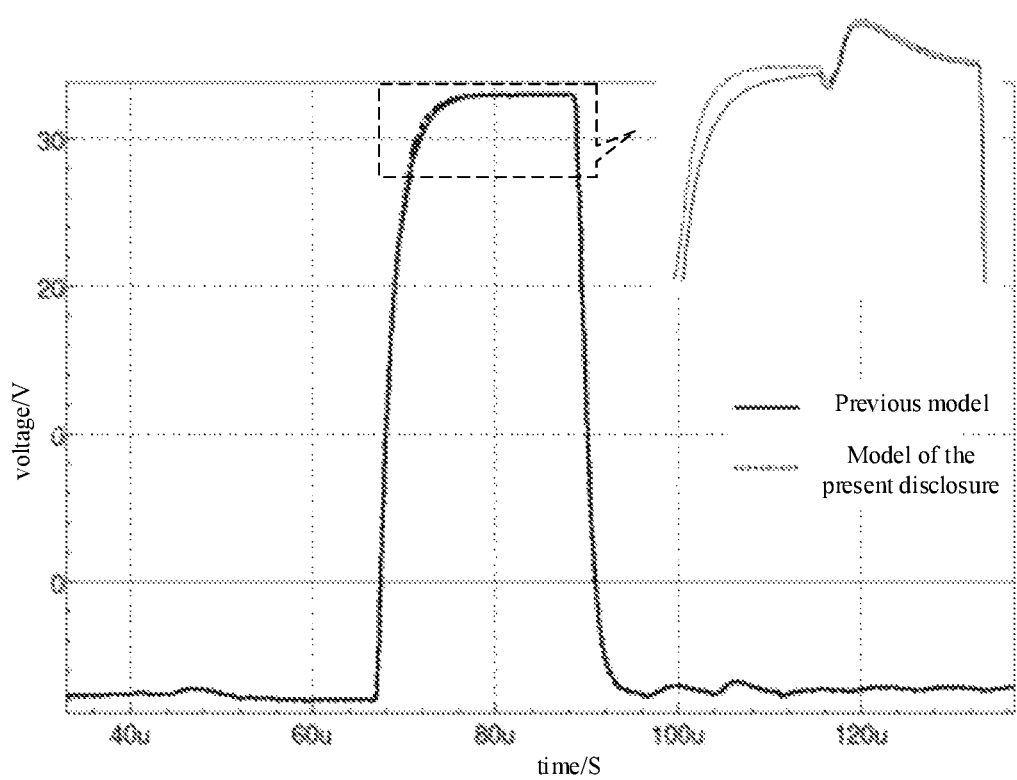
FIG. 6 is a view schematically showing a simulation of an output signal of a shift register unit according to an exemplary embodiment of the present disclosure.

Based on the above description, when the first power signal is at a high level and the second power signal is at a low level, the voltage of the pull-up node PU actually comes from the first power signal; similarly, when the second power signal is at a high level, and the first power signal is at a low level, the voltage of the pull-up node PU actually comes from the second power signal. It can be seen that the charging signal of the pull-up node PU is directly provided by the power signal, instead of being provided by the output signal of a previous stage in the cascade structure. Thus, the signal delay is obviously addressed. The specific effect can be seen from FIG. 6. FIG. 6 shows a Smartspice simulation diagram. It can be seen from the enlarged view of the output waveform that the rise time Tr of the output signal of the shift register unit provided by the present exemplary embodiment is reduced compared to that in the prior art, and the peak voltage Vmax of the output signal is also increased. That is, the signal delay of the output waveform of the present disclosure is improved.

An exemplary embodiment of the present disclosure also provides a shift register circuit that can be used as a gate drive circuit. Referring to FIG. 2, the shift register circuit may include a plurality of cascaded shift register units each of which may be the shift register unit as described above. The signal output terminal Output of the (N−3)-th stage shift register unit is connected to the signal input terminal Input of the N-th stage shift register unit. The signal output terminal Output of the (N+3)-th stage shift register unit is connected to the second reset signal terminal Reset2 of the N-th stage shift register unit. The signal output terminal Output of the (N+4)-th stage shift register unit is connected to the first reset signal terminal Reset1 of the N-th stage shift register unit; N is an integer and N≥3. The input signals of the first to three stages of shift register units can be provided by the start signal STV In other exemplary embodiments, the signal terminal connection manner of the cascaded structure of the shift register circuit is not limited to that described above, and may be adjusted according to actual conditions, which is not specifically limited herein.

It should be noted that the specific details of each circuit unit in the shift register circuit have been described in detail in the embodiments of the shift register unit, and repeated descriptions will be omitted here.

An exemplary embodiment of the present disclosure also provides a display panel including a display area and a peripheral area; wherein the peripheral area of the display panel may be provided with the shift register circuit described above. The display area of the display panel may include a plurality of gate lines and a plurality of data lines which are arranged horizontally and vertically, respectively, and a plurality of pixel units defined by adjacent gate lines and adjacent data lines. The gate lines are configured to transmit scan signals provided by the shift register circuit, and the data lines are configured to transmit data signals provided by a source driver.

In embodiments of the present disclosure, the GOA technology is used to integrate the shift register circuit on the periphery area of the display panel, thereby achieving the design of narrow bezel, and effectively reducing the manufacturing costs of the display panel and improving the yield of the display modules.

In other embodiments, the display panel may be an LCD display panel, an OLED display panel, a PLED (Polymer Light-Emitting Diode) display panel, a PDP (Plasma Display Panel), or the like. The present disclosure does not impose specific limitations on the type of display panel in which the technical solutions may be applied.

An exemplary embodiment of the present disclosure also provides a display device including the above display panel. The display device may include any product or component having a display function, such as a mobile phone, a tablet computer, a television, a notebook computer, a digital photo frame, a navigator, and the like.

It should be noted that although several circuits or units of a device for executing steps are mentioned in the detailed description above, such division is not necessary. Actually, in accordance with embodiments of the present disclosure, the features and functions of the two or more circuits or units described above may be embodied in one circuit or unit. On the contrary, the features and functions of one of the circuits or units described above may be further divided into multiple circuits or units.

In addition, although various steps of the method of the present disclosure are described in a particular order in the figures, this does not imply that the steps must be performed in the specific order, or all the steps shown must be performed to achieve the desired result. Additionally or alternatively, certain steps may be omitted, multiple steps may be combined into one step, and/or one step may be decomposed into multiple steps, and the like.

Through the description of the above embodiments, those skilled in the art will readily understand that the example embodiments described herein may be implemented by software or by a combination of software and necessary hardware. Therefore, the technical solutions according to embodiments of the present disclosure may be embodied in the form of a software product, which may be stored in a non-volatile storage medium (which may be a CD-ROM, a USB flash drive, a mobile hard disk, etc.) or on a network. A number of instructions are included to cause a computing device (which may be a personal computer, a server, a mobile terminal, or a network device, etc.) to perform the methods in accordance with embodiments of the present disclosure.

Other embodiments of the present disclosure will be apparent to those skilled in the art. The present application is intended to cover any variations, uses, or adaptations of the present disclosure, which are in accordance with the general principles of the present disclosure and include common general knowledge or conventional technical means in the art that are not disclosed in the present disclosure. The specification and examples should be construed as exemplary, and the real scope and spirit are defined by the appended claims.

What is claimed is:

1. A shift register unit, comprising:
   an input circuit connected to a signal input terminal, a power signal terminal and a pull-up node and configured to transmit a power signal from the power signal terminal to the pull-up node in response to an input signal;
   an output circuit connected to the pull-up node, a clock signal terminal, and a signal output terminal and configured to transmit a clock signal from the clock signal terminal to the signal output terminal in response to a voltage at the pull-up node;
   a reset circuit connected to a reset signal terminal, a reference signal terminal, the pull-up node and the signal output terminal and configured to transmit a reference signal from the reference signal terminal to the pull-up node and the signal output terminal in response to a reset signal;
   a first pull-down control circuit connected to the pull-up node, the reference signal terminal, a pull-down control node and a pull-down node and configured to transmit the reference signal to the pull-down control node and the pull-down node in response to the voltage signal at the pull-up node;
   a second pull-down control circuit connected to the power signal terminal, the pull-down control node and the pull-down node and configured to transmit the power signal to the pull-down control node and the pull-down node in response to the power signal; and
   a pull-down circuit connected to the pull-down node, the reference signal terminal, the pull-up node and the signal output terminal and configured to transmit the reference signal to the pull-up node and the signal output terminal in response to a voltage signal at the pull-down node,
   wherein the power signal terminal comprises a first power signal terminal and a second power signal terminal;
   a first power signal provided by the first power signal terminal and a second power signal provided by the second power signal terminal have same frequencies but reverse phases.

2. The shift register unit of claim 1, wherein the input circuit comprises:
   a first switching element, wherein a control terminal of the first switching element is connected to the signal input terminal, a first terminal the first switching element is connected to a pull-up control node, and a second terminal the first switching element 1 is connected to the pull-up node;
   a second switching element, wherein a control terminal and a first terminal of the second switching element are connected to the first power signal terminal, and a second terminal of the second switching element is connected to the pull-up control node; and
   a third switching element, wherein a control terminal and a first terminal of the third switching element are connected to the second power signal terminal, and a second terminal of the third switching element is connected to the pull-up control node.

3. The shift register unit of claim 2, wherein:
   the pull-down control node comprises a first pull-down control node, and the pull-down node comprises a first pull-down node;
   the first pull-down control circuit comprises:
   a fourth switching element, wherein a control terminal of the fourth switching element is connected to the pull-up node, a first terminal of the fourth switching element is connected to the reference signal terminal, and a second terminal of the fourth switching element is connected to the first pull-down control node; and
   a fifth switching element, wherein a control terminal of the fifth switching element is connected to the pull-up node, a first terminal of the fifth switching element is connected to the reference signal terminal, and a second terminal of the fifth switching element is connected to the first pull-down node;
   the second pull-down control circuit comprises:
   a sixth switching element, wherein a control terminal and a first terminal of the sixth switching element are connected to the first power signal terminal, and a second terminal of the sixth switching element is connected to the first pull-down control node; and
   a seventh switching element, wherein a control terminal of the seventh switching element is connected to the first pull-down control node, a first terminal of the seventh switching element is connected to the first power signal terminal, and a second terminal of the seventh switching element is connected to the first pull-down node.

4. The shift register unit of claim 3, wherein:
the pull-down control node further comprises a second pull-down control node, and the pull-down node further comprises a second pull-down node;
the first pull-down control circuit further comprises:
an eighth switching element, wherein a control terminal of the eighth switching element is connected to the pull-up node, a first terminal of the eighth switching element is connected to the reference signal terminal, and a second terminal of the eighth switching element is connected to the second pull-down control node; and
a ninth switching element, wherein a control terminal of the ninth switching element is connected to the pull-up node, a first terminal of the ninth switching element is connected to the reference signal terminal, and a second terminal of the ninth switching element is connected to the second pull-down node;
the second pull-down control circuit further comprises:
a tenth switching element, wherein a control terminal and a first terminal of the tenth switching element are connected to the second power signal terminal, and a second terminal of the tenth switching element is connected to the second pull-down control node; and
an eleventh switching element, wherein a control terminal of the eleventh switching element is connected to the second pull-down control node, a first terminal of the eleventh switching element is connected to the second power signal terminal, and a second terminal of the eleventh switching element is connected to the second pull-down node.

5. The shift register unit of claim 4, wherein the pull-down circuit comprises:
a twelfth switching element, wherein a control terminal of the twelfth switching element is connected to the first pull-down node, a first terminal of the twelfth switching element is connected to the reference signal terminal, and a second terminal of the twelfth switching element is connected to the pull-up node;
a thirteenth switching element, wherein a control terminal of the thirteenth switching element is connected to the first pull-down node, a first terminal of the thirteenth switching element is connected to the reference signal terminal, and a second terminal of the thirteenth switching element is connected to the signal output terminal;
a fourteenth switching element, wherein a control terminal of the fourteenth switching element is connected to the second pull-down node, a first terminal of the fourteenth switching element is connected to the reference signal terminal, and a second terminal of the fourteenth switching element is connected to the pull-up node; and
a fifteenth switching element, wherein a control terminal of the fifteenth switching element is connected to the second pull-down node, a first terminal of the fifteenth switching element is connected to the reference signal terminal, and a second terminal of the fifteenth switching element is connected to the signal output terminal.

6. The shift register unit of claim 2, wherein the first switching element, the second switching element and the third switching element are transistors.

7. The shift register unit of claim 3, wherein the fourth switching element, the fifth switching element, the sixth switching element, and the seventh switching element are transistors.

8. The shift register unit of claim 4, wherein the eighth switching element, the ninth switching element, the tenth switching element, and the eleventh switching element are transistors.

9. The shift register unit of claim 5, wherein the twelfth switching element, thirteenth switching element, the fourteenth switching element, and the fifteenth switching element are transistors.

10. The shift register unit of claim 1, wherein the output circuit comprises:
a sixteenth switching element, wherein a control terminal of the sixteenth switching element is connected to the pull-up node, a first terminal of the sixteenth switching element is connected to the clock signal terminal, and a second terminal of the sixteenth switching element is connected to the signal output terminal; and
a storage capacitor connected between the pull-up node and the signal output terminal.

11. The shift register unit of claim 10, wherein sixteenth switching element is a transistor.

12. The shift register unit of claim 1, wherein:
the reset signal terminal comprises a first reset signal terminal and a second reset signal terminal;
the reset circuit comprises:
a seventeenth switching element, wherein a control terminal of the seventeenth switching element is connected to the first reset signal terminal, a first terminal of the seventeenth switching element is connected to the reference signal terminal, and a second terminal of the seventeenth switching element is connected to the pull-up node; and
an eighteenth switching element, wherein a control terminal of the eighteenth switching element is connected to the second reset signal terminal, a first terminal of the eighteenth switching element is connected to the reference signal terminal, and a second terminal of the eighteenth switching element is connected to the signal output terminal.

13. The shift register unit of claim 12, wherein the seventeenth switching element and the eighteenth switching element are transistors.

14. A shift register circuit comprising N stages which are connected in cascade, where N is a positive integer greater than or equal to 3;
wherein each of the stages is a shift register unit, which comprises:
an input circuit connected to a signal input terminal, a power signal terminal and a pull-up node and configured to transmit a power signal from the power signal terminal to the pull-up node in response to an input signal;
an output circuit connected to the pull-up node, a clock signal terminal, and a signal output terminal and configured to transmit a clock signal from the clock signal terminal to the signal output terminal in response to a voltage at the pull-up node;
a reset circuit connected to a reset signal terminal, a reference signal terminal, the pull-up node and the signal output terminal and configured to transmit a reference signal from the reference signal terminal to the pull-up node and the signal output terminal in response to a reset signal;
a first pull-down control circuit connected to the pull-up node, the reference signal terminal, a pull-down control node and a pull-down node and configured to transmit the reference signal to the pull-down control node and the pull-down node in response to the voltage signal at the pull-up node;

a second pull-down control circuit connected to the power signal terminal, the pull-down control node and the pull-down node and configured to transmit the power signal to the pull-down control node and the pull-down node in response to the power signal; and a pull-down circuit connected to the pull-down node, the reference signal terminal, the pull-up node and the signal output terminal and configured to transmit the reference signal to the pull-up node and the signal output terminal in response to a voltage signal at the pull-down node;

wherein:

if the reset signal terminal comprises a first reset signal terminal and a second reset signal terminal, a signal output terminal of a (N−3)-th stage is connected to a signal input terminal of a N-th stage;

a signal output terminal of a (N+3)-th stage is connected to a second reset signal terminal of the N-th stage;

a signal output terminal of a (N+4)-th stage is connected to a first reset signal terminal of the N-th stage.

15. A display panel comprising a display area and a peripheral area;

wherein the peripheral area is provided with the shift register circuit of claim 14.

* * * * *